United States Patent
Heid

(10) Patent No.: US 7,443,166 B2
(45) Date of Patent: Oct. 28, 2008

(54) METHOD AND MAGNETIC RESONANCE APPARATUS FOR GENERATING A MEASUREMENT SEQUENCE EXECUTABLE BY APPARATUS HARDWARE

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 11/774,871

(22) Filed: Jul. 9, 2007

(65) Prior Publication Data

US 2008/0024129 A1 Jan. 31, 2008

(30) Foreign Application Priority Data

Jul. 25, 2006 (DE) .................... 10 2006 034 397

(51) Int. Cl.
 *G01V 3/00* (2006.01)
(52) U.S. Cl. ........................... 324/322; 324/307
(58) Field of Classification Search ............... 324/322, 324/318, 306, 307, 309
 See application file for complete search history.

(56) References Cited

U.S. PATENT DOCUMENTS

| | | | |
|---|---|---|---|
| 5,144,242 A * | 9/1992 | Zeilenga et al. ............ | 324/312 |
| 5,317,260 A * | 5/1994 | Kasten et al. ............... | 324/309 |
| 5,512,825 A | 4/1996 | Atalar et al. | |
| 5,606,258 A * | 2/1997 | Hoenninger et al. ........ | 324/309 |
| 6,348,793 B1 * | 2/2002 | Balloni et al. .............. | 324/309 |
| 6,407,548 B1 * | 6/2002 | Dietz .......................... | 324/307 |
| 6,636,038 B1 | 10/2003 | Heid | |
| 7,053,614 B2 * | 5/2006 | Hornung .................... | 324/312 |
| 7,078,899 B2 * | 7/2006 | Dale et al. .................. | 324/314 |
| 7,081,750 B1 * | 7/2006 | Zhang ......................... | 324/309 |
| 2004/0263166 A1 | 12/2004 | Kluge | |
| 2005/0057249 A1 | 3/2005 | Dale et al. | |
| 2005/0154292 A1 * | 7/2005 | Tank .......................... | 600/410 |

FOREIGN PATENT DOCUMENTS

DE 102 13 848 10/2003

OTHER PUBLICATIONS

"Chebyshev Series For Designing RF Pulses Employing An Optimal Control Approach," Ulloa et al, IEEE Trans. On Medical Imaging, vol. 23, No. 11 (Nov. 2004), pp. 1445-1452.

"A Doubly Adaptive Approach To Dynamic MRI Sequence Estimation," Hoge et al, IEEE Trans. On Image Processing, vol. 11, No. 11 (Oct. 2002), pp. 1168-1178.

* cited by examiner

*Primary Examiner*—Louis M Arana
(74) *Attorney, Agent, or Firm*—Schiff Hardin LLP

(57) ABSTRACT

In a method and magnetic resonance apparatus for generation of a measurement sequence that can be executed with the hardware of the magnetic resonance apparatus, a measurement sequence is generated as a series of time slices of different time slice types, with the control signals for the magnetic resonance apparatus during each time slice being determined using parameters describing these time slices. After division of the measurement sequence into a number of time slices dependent on the sequence type and on a k-space sampling type, descriptive variables are associated with the time slices. Value ranges of the variables are limited and/or the variables are set in relation to one another using boundary conditions. A determination ensues of solution values of the variables with which a predetermined target parameter of the measurement sequence is optimized. A measurement sequence executable on the hardware is attained by association of the solution values with the corresponding parameters of the time slices.

16 Claims, 7 Drawing Sheets

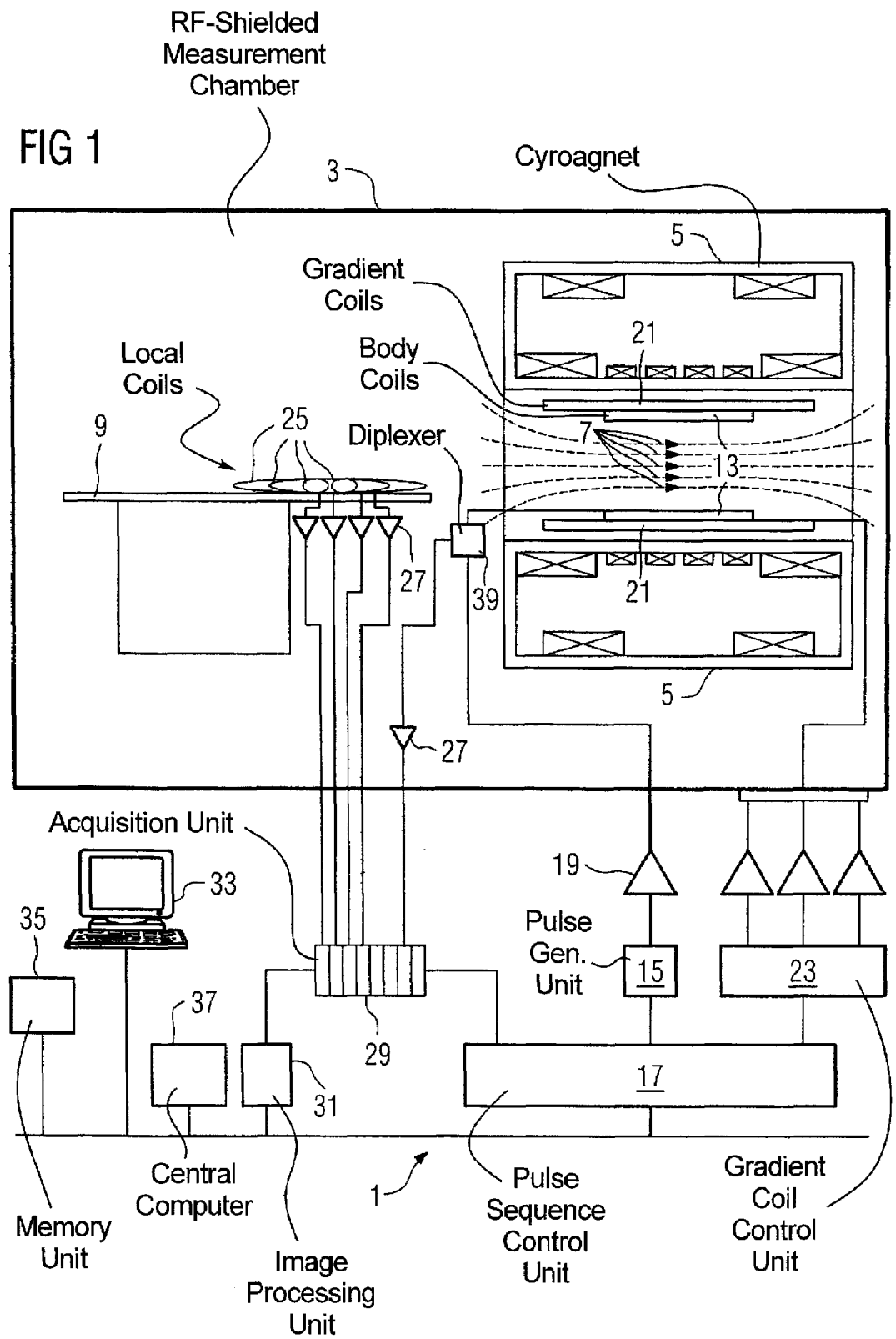

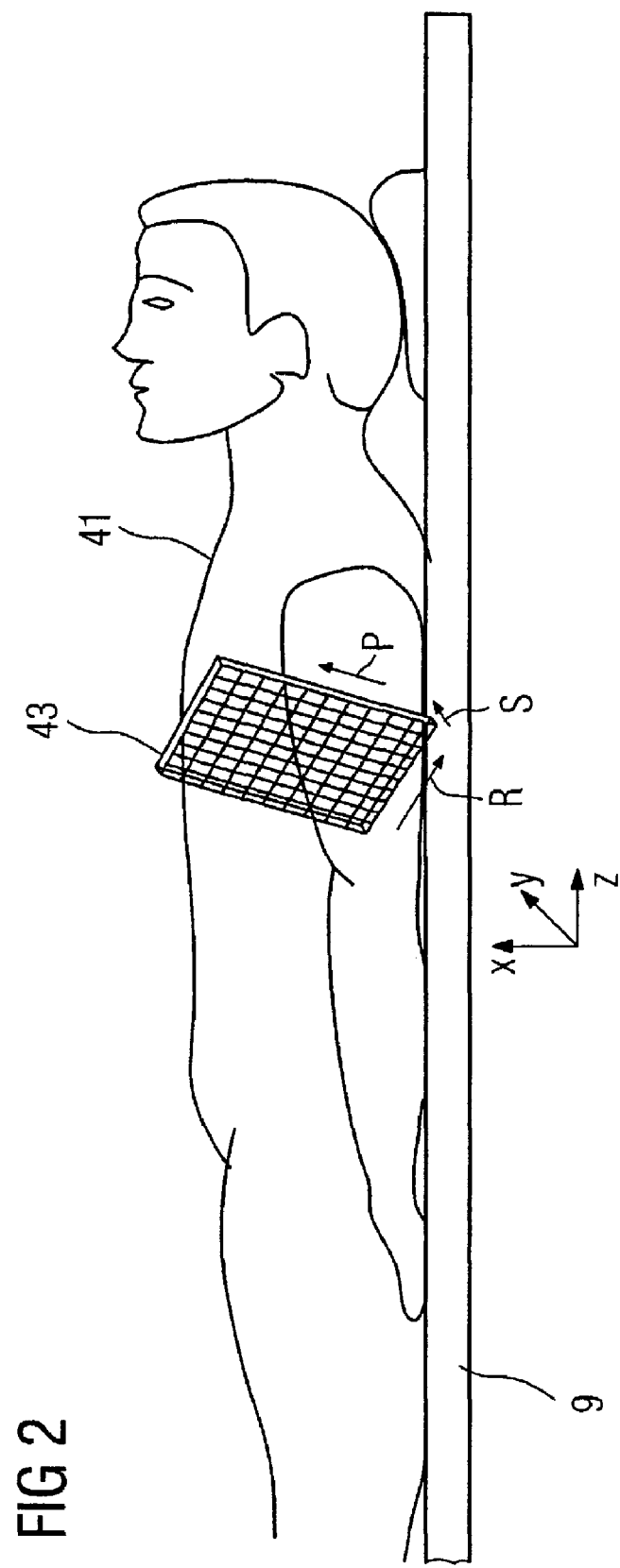

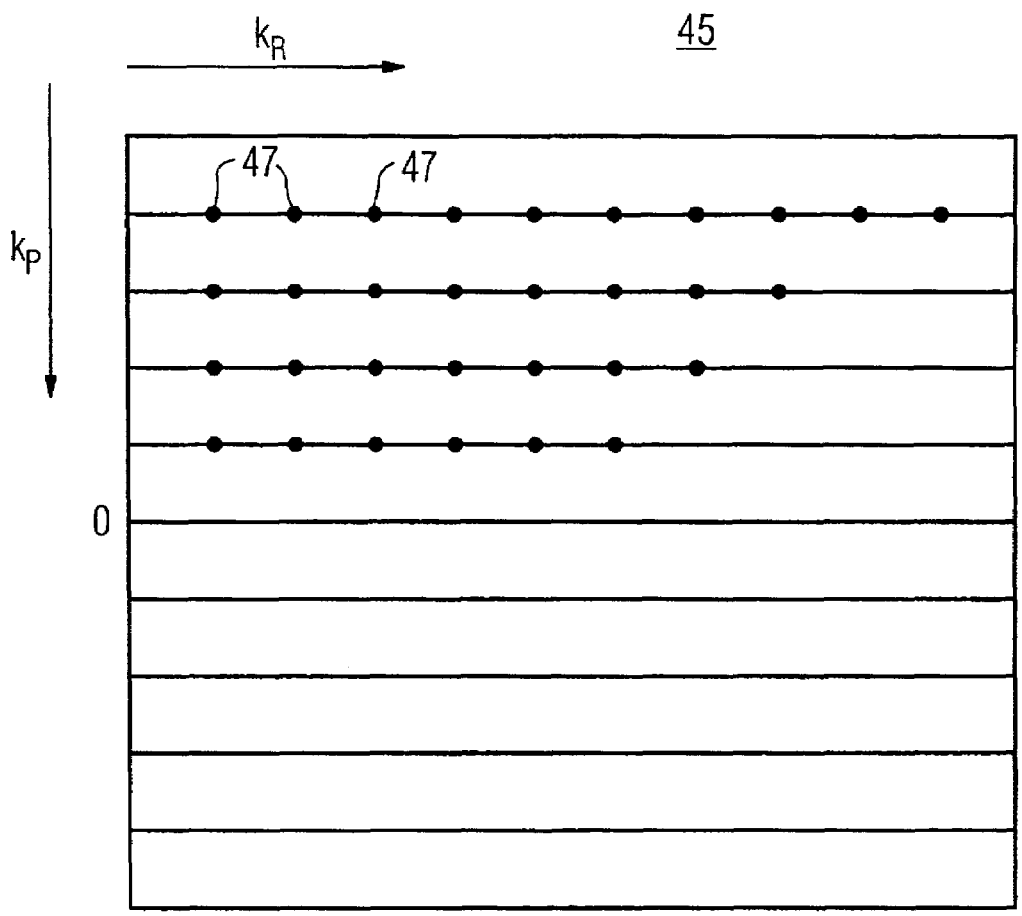

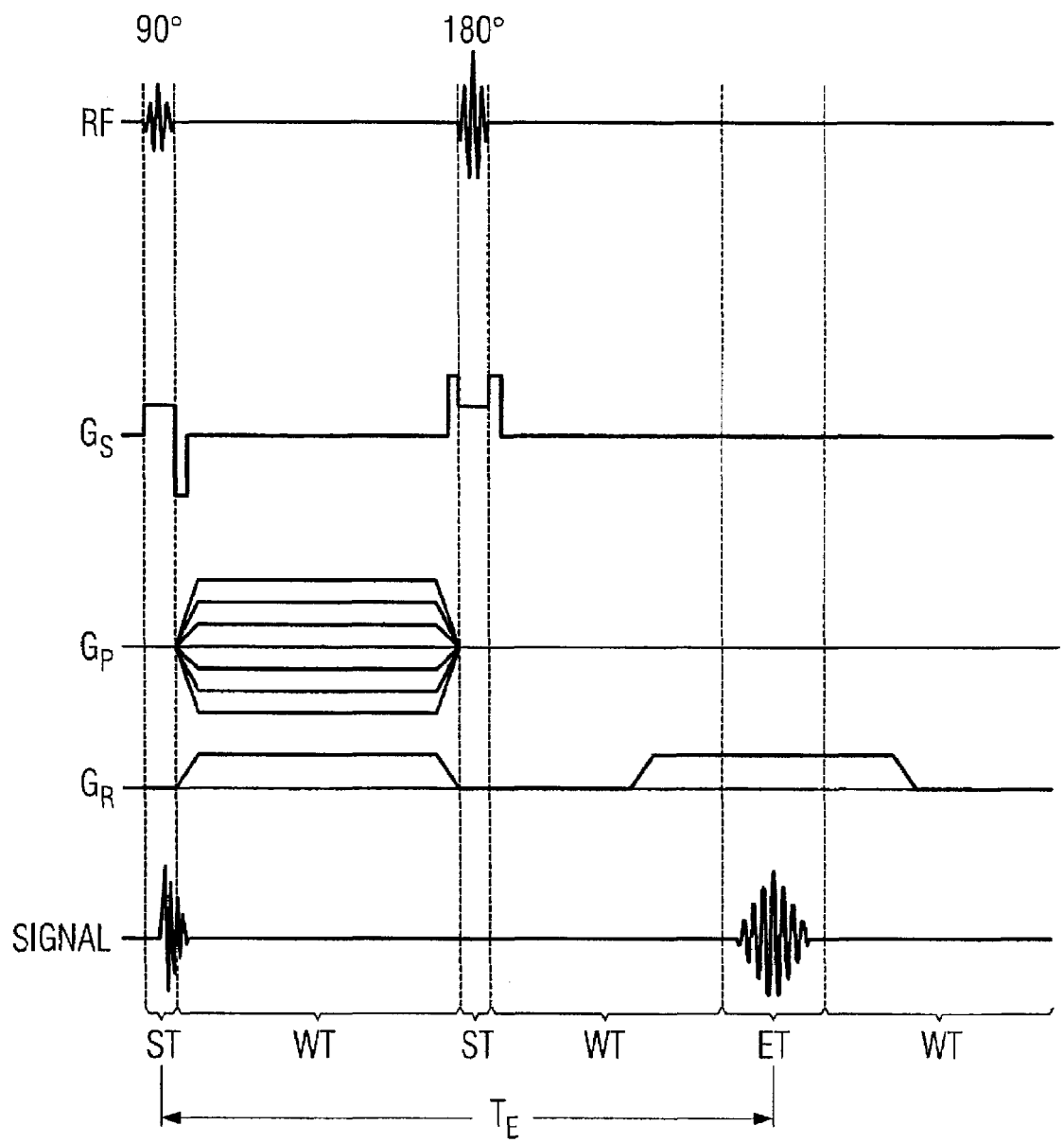

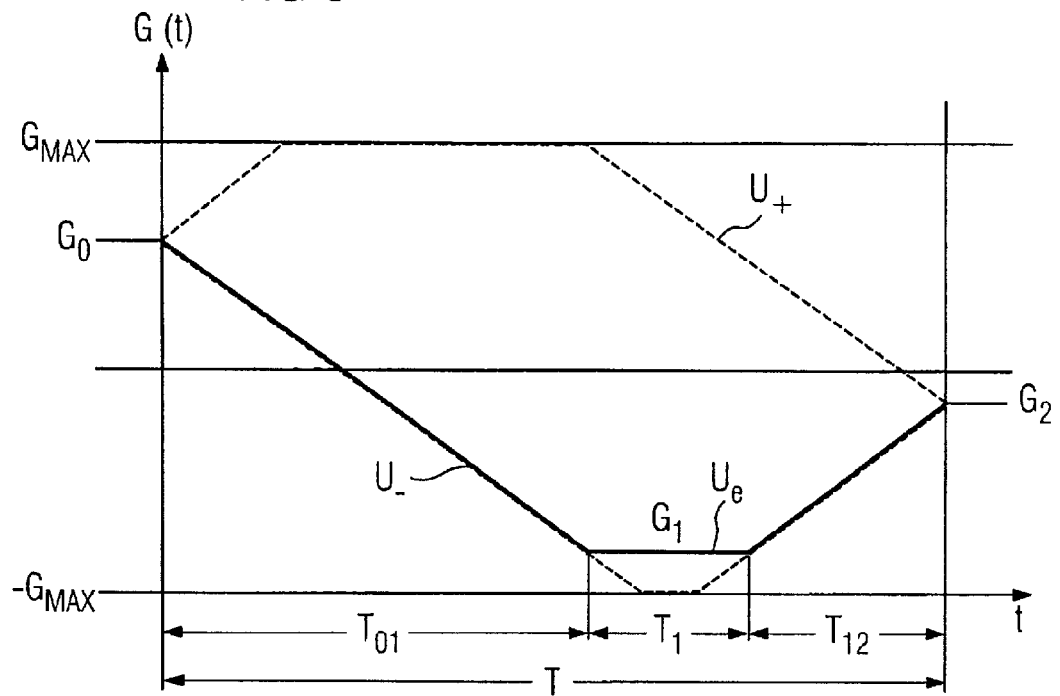
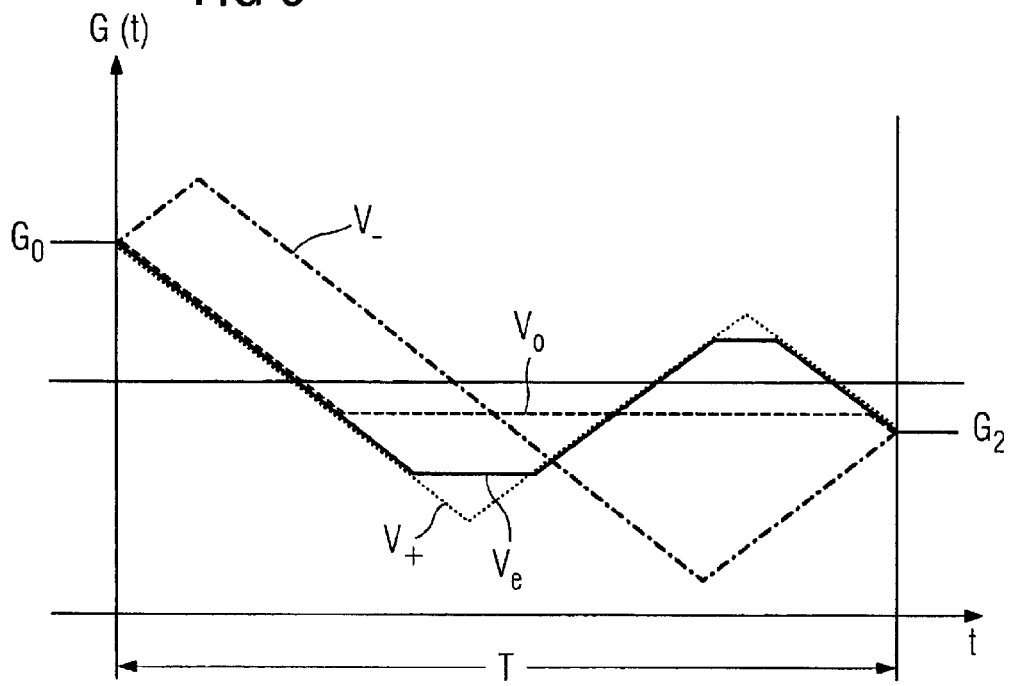

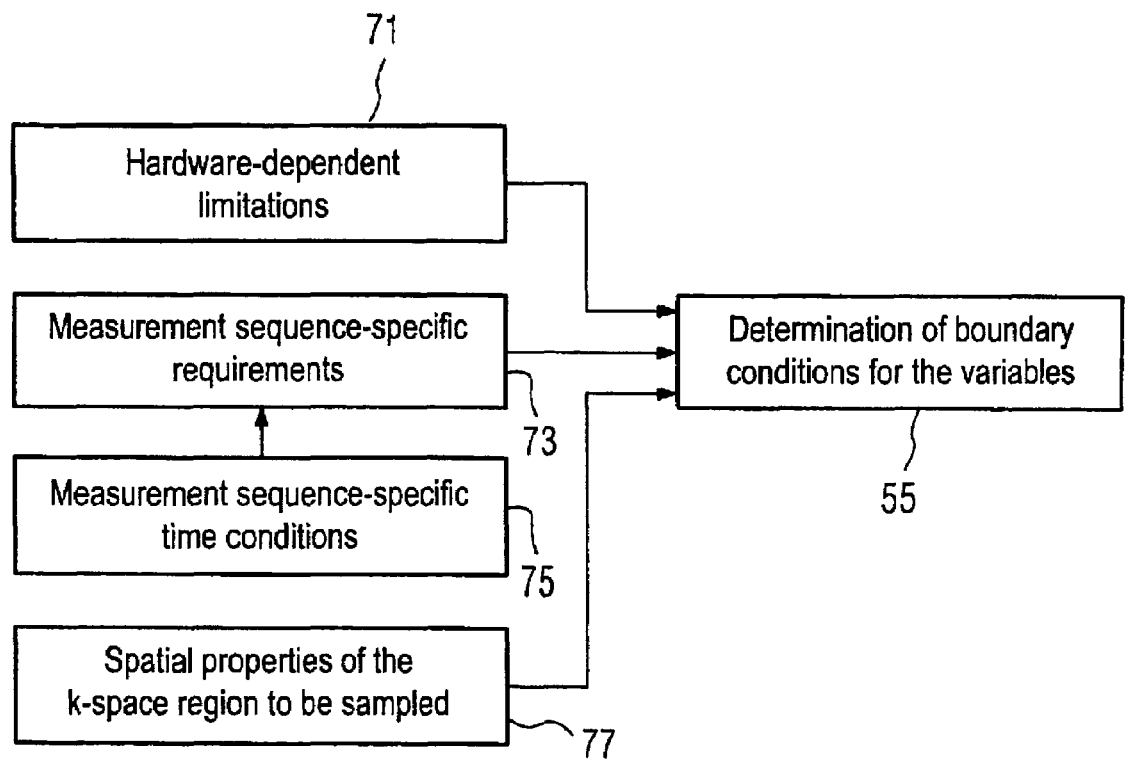

METHOD AND MAGNETIC RESONANCE APPARATUS FOR GENERATING A MEASUREMENT SEQUENCE EXECUTABLE BY APPARATUS HARDWARE

BACKGROUND OF THE INVENTION

1. Field of the Invention

The present invention in general concerns the field of magnetic resonance imaging as used in medicine for examination of patients. The present invention is in particular concerned with the planning and implementation of measurement sequences that allow the hardware used in a magnetic resonance apparatus to be utilized as optimally as possible. Furthermore, the invention concerns a magnetic resonance apparatus and a computer program with which such a method can be implemented.

2. Description of the Prior Art

Magnetic resonance imaging (MR imaging), also known as magnetic resonance tomography (MRT), is based on the physical phenomenon of nuclear magnetic resonance. In this examination modality a subject is exposed to a strong, constant magnetic field. The nuclear spins of the atoms in the subject, which were previously randomly oriented, thereby align. Radio-frequency energy can now excite these "ordered" nuclear spins to specific resonant oscillations. These nuclear magnetic resonances generate the actual measurement signal which is acquired by means of suitable reception coils. Through the use of inhomogeneous magnetic fields (also called gradient fields) that are generated by gradient coils, the measurement signal can be spatially coded with regard to every spatial direction, which is generally designated as "spatial coding".

The acquisition of the data in MR imaging occurs in k-space (frequency space). The MR image in the image domain is linked with the MR data in k-space by means of Fourier transformation. The spatial coding of the subject which spans k-space occurs by means of gradients in all three spatial directions. Differentiation is made among the slice selection gradient (establishes an acquisition slice in the subject, often the z-axis), the frequency coding gradient (establishes a direction in the slice, often the x-axis) and the phase coding gradient (determines the second dimension within the slice, often the y-axis). A slice is thus initially selectively excited, for example in the z-direction. The coding of the spatial information in the slice ensues via a temporally defined radiation of gradient fields orthogonal to the slice before and during the acquisition of the magnetic resonances, thus in this example by gradient fields that are generated by the gradient coils in the x-direction and y-direction. This coding of the spatial information is also designated as phase and frequency coding.

The entirety of the temporal sequence of the RF pulses and the gradient fields for excitation of the nuclear spins in the image volume to be measured, for signal generation and for spatial coding is known as a measurement sequence. Among other things, the measurement sequence establishes the spatial and temporal characteristic with which k-space is scanned and thereby determines spatial properties of the acquired image (for example extent of the shown region and resolution of the image), or the contrast with which the different tissue types in the image are shown.

It has conventionally been typical that a measurement sequence is completely predetermined by a computerized sequence programmer, with a user allowed only the variation of a specific few variable user parameters within narrow limits. The procedure is advisable since not every conceivable measurement sequence can be realized in a magnetic resonance apparatus due to hardware-dependent limitations. For the user to be able to devise the measurement sequence, the user would have to precisely know the hardware properties of a magnetic resonance apparatus and take these into account in the programming of the measurement sequence together with the variable user parameters so that a measurement sequence that can actually be executed is available at the end. This makes manual sequence programming as well the customizing of a measurement sequence to various systems complicated.

Moreover, the entire possible variation range of the variable user parameters often can not be made available to a user, since the user parameters themselves often depend on one another and on the employed hardware in a complicated manner. For example in order to allow the entire possible parameter space to be selected, all of these complex dependencies of the user parameters would have to be taken into account, which is why it is often simpler to limit the parameter space in advance. For example, the repetition time and the slice thickness depend on one another in a hardware-specific manner. Both of these are user parameters that are often set by a user in a measurement sequence. For this dependency is to be accounted for with generality in the selection of the user parameters would require a large effort and would be dependent on the underlying hardware.

In spite of these often-complex associations between hardware-dependent limitations and adjustable user parameters, a certain degree of freedom still remains in the concrete realization of the measurement sequence after a special selection of user parameters by the user. This means that a sequence programmer also still has latitude in the realization of the measurement sequence after specification of the user parameters by the user and according to the requirements of the specific hardware limitations; thus the measurement sequence can still be realized in different ways, with the different ways nevertheless leading to an essentially identical image result. In general, however, they will still differ with regard to other variables such as, for example, the total duration of the measurement or the loading stressing of individual components of the magnetic resonance apparatus (for example of the gradient coils). These freedoms represent a complication for the sequence programmer since he or she must ultimately make a specific selection with the realization that for the most part, it will not be the optimal selection due to the complex correlations of the user parameters.

Some methods are known with which parts of a measurement sequence can at least be improved. Before describing these methods, the basic concept that underlies many of these methods will be explained.

In recent times it has proven to be advantageous to consider measurement sequences for magnetic resonance imaging as a series of time slices that respectively belong to different types. A first time slice type is thereby the transmission type that is characterized by the presence of in that an RF excitation pulse that is radiated (usually during activation of gradient fields) in time slices of this type. A second type is the acquisition type, characterized by the measurement signal of excited nuclear spins being acquired in time slices of this type. A third time slice type is the warp type, wherein no transmission or acquisition activity exists but gradient fields are radiated (activated) in order to effect a phase coding of the nuclear spins or in order to impress a specific flow coding or diffusion coding on the nuclear spins. The consideration of a measurement sequence as a series of time slices of different types has proven to be advantageous since each type exhibits specific properties for which optimization strategies have been developed.

For example, a method with which dead times in MR pulse sequences can be minimized is described in U.S. Pat. No. 5,512,825. The dead times (dead periods) described therein correspond to the time slices of the warp type described above that exist between time slices of the transmission type and the acquisition type.

In contrast to this, DE 102 14 736 A1 describes a method with which a sampling path within the k-matrix can be calculated under given boundary conditions, wherein the gradient current curves are determined that lead to a sampling along the previously-calculated sampling path given application to the corresponding gradient coils using an analog-digital converter. Boundary conditions that can be taken into account in the calculation of the sampling path are, for example: the maximum load of the gradient amplifier given arbitrary rotation of the k-space matrix, the spatial position of the k-space matrix to be sampled in the subject to be examined, the arrangement of the measurement points in the k-space matrix to be sampled, the sequence type of the sampling, the departure and arrival speed of each measurement point of the k-space matrix, the sequence (order) in which the measurement points of the k-space matrix should be sampled, the avoidance of nerve stimulations of the subject to be examined, and the minimization of the sampling time, the minimization of the slew rate during the sampling.

U.S. Pat. No. 6,636,038 describes a method for controlling a pulse sequence for a nuclear magnetic resonance tomography system in which a control data set for gradient fields, RF pulses and sampling pulses is calculated during the run time of the pulse sequence. The pulse sequence is considered as a series of the time slices cited above. Furthermore, given a specific form of a trapezoidal dephaser gradient pulse train, an optimized trapezium shape of the gradient coil current for a gradient coil is determined such that the gradient coil system is utilized in an improved manner.

With the methods presented here a sequence programmer can be supported to the extent that parts of a measurement sequence are automatically optimized without the sequence programmer having to explicitly specify these parts. After the implementation of those aids, however, the problem also remains that large parts of a measurement sequence must still be manually established. This establishment, which must be made by the sequence programmer before execution of a measurement sequence, often represents a non-optimal compromise between flexibility of the measurement sequence and the hardware-specific optimization of the measurement sequence.

SUMMARY OF THE INVENTION

An object of the present invention is to provide a method with which a measurement sequence can in large part be automatically generated and executed with good utilization of the hardware of the magnetic resonance apparatus, with the need for only non-burdensome specification of parts of the measurement sequence by the sequence programmer. Furthermore, it is an object to provide a magnetic resonance apparatus or a computer program with which it is possible in large part to automatically generate and to execute a measurement sequence adapted to the magnetic resonance apparatus with good utilization of the hardware of the magnetic resonance apparatus, and only non-burdensome specification of portions of the measurement sequence by the sequence programmer.

The above object is achieved in accordance with the invention by a method for generation of a measurement sequence that can be executed on a hardware of a magnetic resonance apparatus, wherein the measurement sequence is generated as a series of time slices, whereby each time slice being associated with one of the time slice types "transmission type", "acquisition type" or "warp type", and wherein control signals for the hardware of the magnetic resonance apparatus during one of the time slices can be determined using the time slice type of this time slice and using parameters describing this time slice, according to the following steps:

division of the measurement sequence into time slices dependent on the sequence type and on a k-space sampling type, with each time slice being associated with one of the time slice types "transmission type", "warp type" or "acquisition type", association of variables with each time slice, wherein for each time slice, a variable is associated with each parameter describing this time slice, determination of boundary conditions with which value ranges of the variables are limited and/or the variables are set in relation to one another, determination of solution values of the variables with which a predetermined target parameter of the measurement sequence is optimized under consideration of the boundary conditions, and generation of the measurement sequence executable on the hardware by association of the solution values with the corresponding parameters of the time slices.

The problem of the generation of a measurement sequence is thus formulated as a mathematical optimization problem in the inventive method. The concept that the measurement sequence is initially divided into a series of time slices forms the basis of this optimization problem. Each of these time slices is described using a few parameters that now enter into the optimization problem as variables.

The conditions characterizing a measurement sequence as well as the limitations predetermined by the hardware enter into the optimization problem by being formulated as boundary conditions with which value ranges of the variables are limited and/or the variables are set in relation to one another. When the mathematical optimization problem is solved, the conditions that must be satisfied during a measurement sequence (and previously had to be individually considered by a sequence programmer in conventional methods) are automatically satisfied.

The method is based on the recognition that the control signals for the hardware of a magnetic resonance apparatus during one of the time slices do not need to be entirely specified by a sequence programmer. Rather, these control signals can be automatically determined from the parameters describing this time slice. Only by this approach it is possible to build on parameters describing the time slices and to formulate a mathematical optimization problem using these parameters.

An executable measurement sequence can be obtained after finding the solution values for the variables (i.e. after establishing concrete values for the parameters describing the time slices) by the individual time slices being successively processed. This means that the control signals for the hardware of the magnetic resonance apparatus during a time slice are now determined using the parameters of this time slice that are now established.

The measurement sequence is consequently optimized as a whole in the inventive method. Instead of conventional methods with which only portions of a measurement sequence can be optimized with regard to specific target values, in the inventive method, which optimizes the entire measurement sequence as a whole, it is possible for the first time to automatically take complex dependencies of the individual time slices among one another into account within the measurement sequence.

Such dependencies cannot be accounted for in total with conventional methods, even if various optimization methods were used in parallel for optimization of individual parts of a measurement sequence, since these optimization methods would run independently of one another and could not take into account the dependencies of the various parts, which would respectively be optimized separately. Completely new measurement sequences are achievable in accordance with the inventive method that are optimized as a whole to a wide variety of predeterminable properties.

In an embodiment, one of the various sequences of the time slices, in which the predetermined target parameter of the measurement sequence is optimized under consideration of the boundary conditions, is additionally determined in the determination of the solution values. That temporal permutation of the time slices for which the predetermined target parameter of the measurement sequence is optimized under consideration of the boundary conditions is thereby determined. In this embodiment of the method, the target parameter of the measurement sequence can thus be better optimized again, since now the order of the time slices is not rigidly predetermined but also enters into the optimization problem and is optimized.

In a further embodiment of the method, at least one part of the boundary conditions is altered in the event that no solution values can be found in the determination of the solution values of the variables. The determination of the solution values of the variables then is re-done under consideration of the changed boundary conditions. In this embodiment of the method, the situation can also now be taken into account that occurs when requirements for the measurement sequence are posed (for example when a user desires specific measurement sequence parameters) that cannot be realized on the hardware of the MR apparatus. In this case, the boundary conditions lead to the situation that the value ranges of the variables are limited such that no solution values of the variables can be found for the optimization problem. In this case a user can be made aware of the occurring problem. The problem can then be countered by at least one part of the boundary conditions being altered (for example relaxed) and the method is re-implemented with the altered boundary conditions.

The parameters describing one of the time slices preferably at least include
  a time duration of this time slice,
  a gradient-time integral of this time slice and
  start and end values of gradient amplitudes at the beginning or, respectively, at the end of this time slice.

It has been shown that a time slice can be described with these relatively few parameters.

The determination of the solution values of the variables preferably ensues by
  the target parameter is specified as a function of the variables,
  a point at which the target function assumes an external value is determined in a multi-dimensional space that encompasses the variables and is limited by the boundary conditions and
  the solution values of the variables correspond to the coordinates of the point.

The boundary conditions can be specified as equalities and/or inequalities of the variables. The equalities and/or inequalities preferably are linearized. The mathematical optimization problem can be implemented particularly simply through the linearization of the equalities and/or the inequalities.

In another embodiment, a simplex optimization method is used to determine the point in the multi-dimensional space. This optimization method is particularly suitable for a simple and fast implementation on a computer.

The boundary conditions preferably include first boundary sub-conditions with which the measurement sequence-specific requirements are set. In this case measurement sequence-time conditions can be ensured by the first boundary sub-conditions. For example, repetition times, echo times, spin echo time conditions, spin echo gradient rephasing conditions or similar conditions are among these measurement sequence-specific time conditions.

The boundary conditions preferably also include second boundary sub-conditions with which spatial properties of a k-space range to be sampled are set. For example, the size and the resolution of the k-space matrix to be sampled and, connected with this, also the size and the resolution of the image region to be presented as well as the position and orientation of the image region to be presented are among these spatial properties.

The boundary conditions can also include third boundary sub-conditions with which limitations predetermined by the hardware of the magnetic resonance apparatus are set. For example, the limitations predetermined by the gradient coils, the maximum gradient field amplitude and/or maximum slew rate of the gradient field amplitudes are among these third boundary sub-conditions. The various conditions that are predetermined by the hardware of the magnetic resonance apparatus or by the measurement sequence can be satisfied in this manner. Further limitations predetermined by the hardware can likewise be taken into account by being formulated as boundary conditions in the variables. These can be, for example, limitations of the gradient amplifier (here, for example: the short-term maximum current, the maximum continuous current, the time rule that describes how long a specific gradient amplitude can be applied to a person, the output voltage), of the gradient coils (for example: the maximum current, the maximum voltage, their inductance and ohmic resistance; their sensitivity, their thermal resistance and thermal time constant, possibly frequency components to be avoided in the gradient current including bandwidth due to magnetic resonance points), of the radio-frequency transmitters (for example: the peak power and the average power, the duty cycle, the maximum pulse duration, the transmission-acquisition switch-over times) or of the radio-frequency receivers (for example: the maximum scan rate, the step width of the possible scan rates; the maximum data rate, their activation and deactivation times).

The more limitations that are taken into account as conditions, the fewer limitations that must be explicitly considered in the design of a measurement sequence by a sequence programmer.

At least one value range of at least one variable is advantageously limited by the boundary conditions. Furthermore, the respective variables associated with one of the time slices can be set in relation to one another by the boundary conditions. Variables that are associated with different time slices are also advantageously set in relation to one another by the boundary conditions.

The target parameter that is optimized via the method is preferably a temporal quantity of the measurement sequence. For example, the total measurement duration of a measurement sequence is a typical quantity that is optimized by the method, i.e. minimized in this case.

The above object also is achieved in accordance with the present invention by a control unit for a magnetic resonance apparatus that is operable to implement the method as described above, including all embodiments thereof.

The above object also is achieved in accordance with the present invention by a computer-readable medium encoded with a data structure that is loadable into a computer of a magnetic resonance system in order to implement the method described above, including all embodiments thereof.

BRIEF DESCRIPTION OF THE DRAWINGS

FIG. 1 schematically illustrates an embodiment of a magnetic resonance apparatus operable in accordance with the present invention.

FIG. 2 schematically illustrates a patient to be examined with an image region to be scanned.

FIG. 3 schematically shows the k-space matrix associated with the image region to be scanned.

FIG. 4 schematically illustrates a spin echo sequence.

FIG. 5 shows the gradient coil curve during a time slice of the warp type with which a zeroth moment can be achieved.

FIG. 6 shows the gradient current curve during a time slice of the warp type with which a zeroth moment and, at the same time, a first moment can be achieved.

FIG. 8 is a schematic overview of various boundary conditions.

DESCRIPTION OF THE PREFERRED EMBODIMENTS

Figure 7:
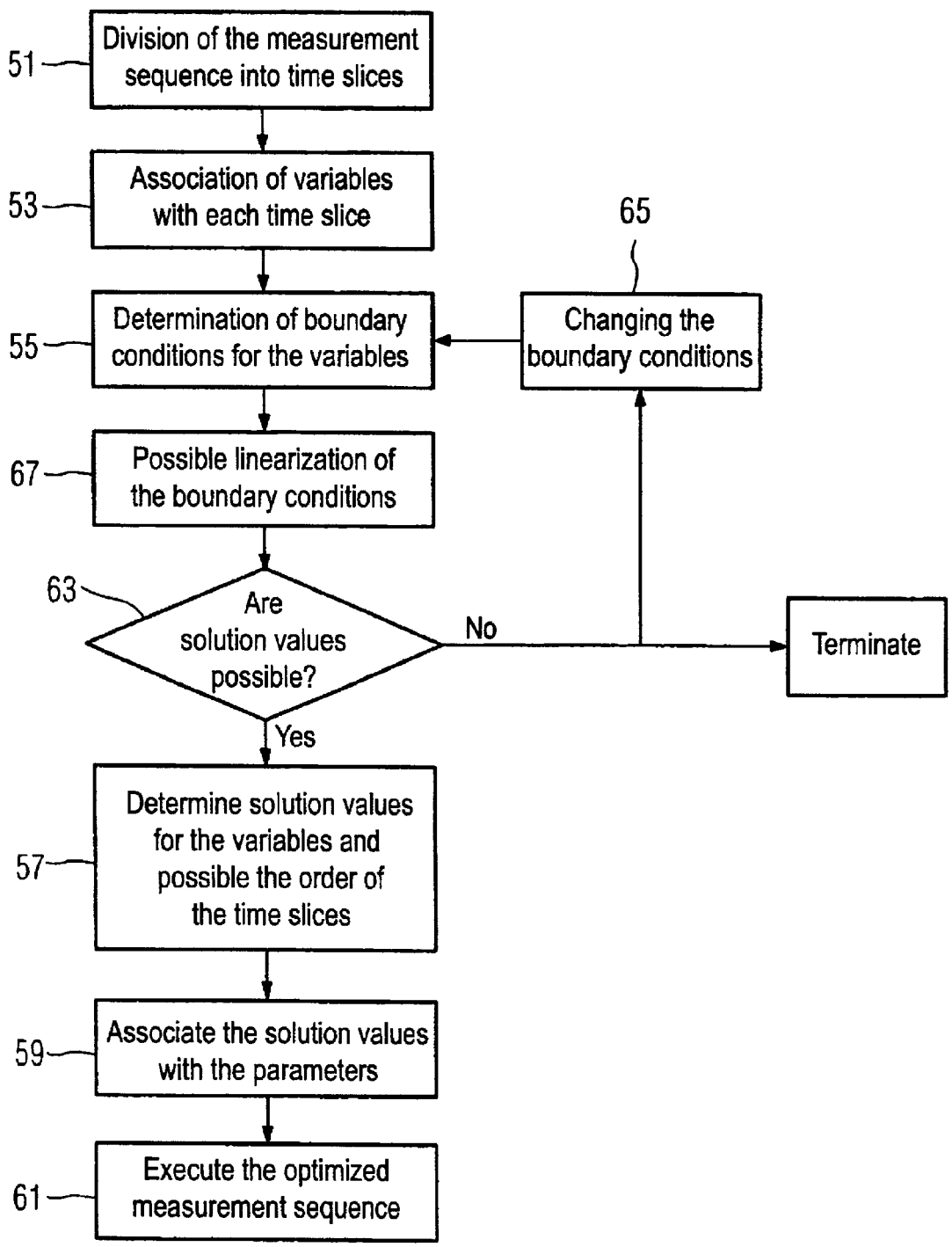
FIG. 7 is an overview of the individual steps of an embodiment of the inventive method.

FIG. 1 schematically shows a basic design of a magnetic resonance apparatus 1. In order to examine a body by means of magnetic resonance imaging, various magnetic fields method to one another as precisely as possible in terms of their temporal and spatial characteristics are radiated at the body.

A strong magnet (typically a cryomagnet 5 with a tunnel-like opening) arranged in a radio-frequency-shielded measurement chamber 3 generates a strong, static basic magnetic field 7 that typically amounts to 0.2 Tesla to 3 Tesla and more. A body or a body part (not shown here) to be examined is borne on a patient bed 9 and positioned in a homogeneous region of the basic magnetic field 7.

The excitation of the nuclear spins of the body ensues by magnetic radio-frequency excitation pulses that are radiated from a radio-frequency antenna shown here as a body coil 13. The radio-frequency excitation pulses are generated by a pulse generation unit 15 that is controlled by a pulse sequence control unit 17. After an amplification by a radio-frequency amplifier 19 they are conducted to the radio-frequency antenna. The radio-frequency system shown here is only schematically indicated. Typically more than one pulse generation unit 15, more than one radio-frequency antenna 19 and a number of radio-frequency antennas are used in a magnetic resonance apparatus 1.

Furthermore, the magnetic resonance apparatus 1 has gradient coils 21 with which magnetic gradient fields for selective slice excitation and for spatial coding of the measurement signal are radiated in a measurement. The gradient coils 21 are controlled by a gradient coil control unit 23 that, like the pulse generation unit 15, is connected with the pulse sequence control unit 17.

The signals emitted by the excited nuclear spins are acquired by the body coil 13 and/or by local coils 25, amplified by associated radio-frequency preamplifiers 27 and further processed and digitized by an acquisition unit 29.

In the case of a coil that can be operated both in transmission mode and acquisition mode (such as, for example, the body coil 13), the correct signal relaying is regulated by an upstream transmission-reception diplexer 39.

An image processing unit 31 generates from the measurement data an image that is presented to a user via an operator console 33 or is stored in a memory unit 35. A central computer 37 controls the individual system components. The computer 37 is thereby fashioned such that the inventive method can be implemented with it.

Before the actual inventive method is described and explained using the schematic drawing in FIG. 7, some concepts that underlie the inventive method and serve for its understanding are explained using FIG. 2 through FIG. 6.

A patient 31 to be examined is scanned in FIG. 2. The image region 43 of which an image of the patient should be produced ("field of view", FOV) is indicated. In the case shown here the image region 43 is a two-dimensional slanted slice through the patient 41. The selected slice in the slice direction S is divided in the readout direction R into N columns and in the direction perpendicular to this (what is known as the phase coding direction P) into M rows by a phase coding, the M rows establishing the number of the image points of the image region 43. The slice direction S, the readout direction R and the phase coding direction P form a logical coordinate system.

A k-space matrix 45 is shown in FIG. 3, and correlates with the image region 43 through a Fourier transformation. The coordinate axes of the k-space matrix 45 are designated with $k_R$ and with $k_P$, corresponding to the image region 43. The acquired measurement data are respectively associated with a coordinate point 47 of this k-space matrix 45 and are Fourier-transformed (possibly after further processing steps) in order to acquire the desired image. Although a two-dimensional image region 43 and thus a two-dimensional k-space matrix 45 based on a Cartesian coordinate system are shown in FIG. 2 and FIG. 3, the present invention is not limited to this specific embodiment of the image region or of the k-space matrix.

In order to acquire the measurement data along the k-space matrix 45, gradient fields corresponding to the orientation of the image region 43 must be switched (activated). Since the orientation of the image region 43 (predetermined by the logical coordinates) typically does not correspond to the orientation of the physical coordinates x, y, z (thus the coordinates that are predetermined by the gradient coils), a transformation between the logical and the physical coordinates typically occurs upon switching of the gradient fields in order to be able to produce the gradient fields (with which the scanning of the k-space matrix 45 is effected) using the gradient coils 21.

The transformation can be done with various methods. A method that is relatively simple and comprehensible for a sequence programmer is to provide the gradient fields in logical coordinates and then to transform these gradient fields into the physical coordinates through a coordinate transformation, assuming that the hardware-specific limits of the gradient amplitudes and the slew rate of the gradient fields is not exceeded by the specification of the gradient fields and by the transformation.

The problem associated with conventional methods, however, already appears in this relatively simple concept. The sequence programmer must already take the limits of the physical gradient coils 21 into account in the design of the gradient fields in the logical coordinates. He or she will do this due to the complexity that results due to the manifold possible slice orientations, but in general can only do so when he or she limits in advance the amplitudes of the logical gradient fields under the specification of the free rotation capability. An optimal utilization of the gradient coils 21 rarely occurs in this manner. This problem, illustrated only in the example of the transformation of the gradient fields, occurs as soon as the sequence programmer, in designing the sequence, must effect limitations to the measurement sequence with regard to the execution capability of the sequence given hardware-dependent limitations.

For the transformation of the gradient fields, U.S. Pat. No. 5,512,825 discloses a method in which—as described above—a transformation of the coordinates is effected such that the time durations of those parts of a sequence given which no transmission or acquisition activity exists are optimized. As is described later, in the inventive method an automatic transformation of logical coordinates into physical coordinates can also be taken into account in which various predetermined target quantities can be optimized.

FIG. 4 shows a pulse sequence with which the method is explained later. Radiated RF pulses (RF for "radio frequency"), received signals (SIGNAL) as well as the gradient fields $G_S$, $G_R$ and $G_P$ switched in the slice orientation S, in the readout direction R and in the phase coding direction P are shown in the individual lines. The pulse sequence shown here corresponds to a spin echo sequence.

Such a pulse sequence can be divided into various time slice types. A time slice of the transmission type ST is characterized by the radiation of an RF pulse, wherein typically a defined, constant gradient is radiated that for the most part serves for selection of the slice S. A time slice of the acquisition type ET is characterized in that the originated signal is sampled with an analog-digital converter, wherein typically a constant, defined gradient is likewise radiated, for the most part for sampling of the measurement signal along a k-space row in the readout direction $k_R$. A time slice of the warp type WT enables the continuity and consistency of the gradient coils between the adjoining time slices as well as the realization of further conditions. For example, a specific distance in k-space can be covered by adherence to a defined gradient-time integral (i.e. a moment of zeroth order $M_0$) and, for example, a phase coding can thereby be enabled. The realization of moments of the first order is used, for example, in speed-sensitive measurements.

The division of a pulse sequence into the described time slice types is therefore reasonable since in this way the course of the gradient currents during one of the time slices does not have to be entirely specified; rather, for each time slice only a few parameters are sufficient in order to determine the control of the hardware (in particular the course of the gradient currents) during the time slice. The parameters thereby reflect the conditions that must be satisfied during a time slice. The determination of the course of the gradient currents is for its part adapted to the hardware of the magnetic resonance apparatus 1 and depends on the respective time slice type.

This concept has the advantage that a sequence programmer need no longer explicitly attend to the control of the hardware since the step of the determination of the control signals—in particular the determination of the gradient current curves—during a time slice can be implemented once on a hardware from the parameters describing the time slice, such that this step can be executed automatically in the following. The inventive method is based on this concept, as is described later.

First however, an explanation of how gradient currents can be determined automatically during a time slice when the time slice is described by a few parameters ensues. Since this conversion is effected dependent on hardware, in the following it is assumed as an example that the hardware on which the conversion ensues includes a gradient coil system with which temporally constant gradient fields can be applied within fixed maximum amplitudes, and that a change of the amplitude with an amplitude-independent and time-independent slew rate can be achieved within established maximum slew rates.

The parameters that are typically used for the description of a time slice are the time duration T of the time slices, the respective gradient amplitudes $G_{0j}$ and $G_{2j}$ at the beginning and at the end of the time slice (whereby the index j characterizes the physical gradient coils 21 ($j \in \{x,y,z\}$)) and possibly also the moments of the k-th order (gradient-time integral) that are realized in the time slice $$M_{k,j} = \int_0^T \tau^k G_j(\tau) d\tau.$$

For the most part only the zeroth moment $M_0$ is of importance; the first moment $M_1$ must predominantly be taken into account in speed-sensitive measurements.

In the following the index j that characterizes the individual gradient axes is omitted in the specification for clarity. Furthermore, in the following listed formulae and correlations, it is assumed without limitation of the generality that the gradient amplitudes, slew rates, times and occurring moments are normalized to dimensionless quantities. The normalization ensues such that maximum amplitudes and maximum slew rates are likewise normalized to 1, such that $-1 \leq G_0 \leq 1$, $-1 \leq G_2 \leq 1$, $-1 \leq \dot{G} \leq 1$ results. $T \geq 0$ applies for the time duration T of a time slice.

The moments $M_k$ to be realized in the time slices are fixed linear combinations from moment vectors that yield the slice thicknesses $s_S$ in the slice direction from the "natural" pixel sizes $s_P$, $s_R$ (provided by a user) in the phase coding direction or, respectively, readout direction. The unity moment $M_0=1$ defines a (possibly anisotropic, axis-specific) spatial resolution $$s = \frac{\dot{G}}{\gamma \hat{G}^2},$$

where $\hat{G}$ is the maximum amplitude of a gradient coil with which all measures of classical three-dimensional space (image space) can be normalized.

1. Gradient Currents during a Time Slice of Warp Type

For a time slice of warp type, a trapezoidal gradient coil curve as is shown, for example, in FIG. 5 can be calculated given predetermined gradient amplitudes $G_0$ and $G_2$ respectively at the beginning and at the end of a time slice and a predetermined time duration T and a predetermined zeroth moment $M_0$. The calculation ensues, for example, using the method described in the exemplary embodiment in U.S. Pat. No. 6,636,038. The gradient current curves shown in FIG. 5 respectively realize a different zeroth moment $M_0$. The dashed gradient current curves $U_+$ and $U_-$ characterize those gradient current curves given which a maximum and minimum moment $M_0$ can be realized, respectively. The maximum gradient amplitudes $G_{MAX}$ and $-G_{MAX}$ provided by the hardware are likewise plotted.

However, not every arbitrary selection of the parameters $G_0$, $G_2$, $M_0$ and T leads to a gradient current curve that can be realized according to the method described in U.S. Pat. No. 6,636,038. So that a gradient current curve realizable in hardware can also be implemented, the following inequality condition must be satisfied: $T \geq T_{min}(G_0, G_2, M_0)$, which is now stated more precisely.

In the case $$M_0 \geq 1 - \frac{G_0^2 + G_2^2}{2},$$

that the time is limited by $$T \geq \frac{G_0^2 + G_2^2}{2} + M_0 + 1 - G_0 - G_2 \quad (1)$$

For $$1 - \frac{G_0^2 + G_2^2}{2} \geq M_0 \geq -\frac{G_0^2 + G_2^2}{2},$$

by contrast, the time is limited by $$T \geq 2\sqrt{\frac{G_0^2 + G_2^2}{2} + M_0} - G_0 - G_2. \quad (2)$$

The first time condition is always more precise in the scope of the second condition than the latter, such that only it can be applied to the entire scope of both conditions, but without loss of achievable parameter space.

In addition, two further timing equations exist that result from the above inequality by a simultaneous algebraic sign change of $M_0$, $G_0$ and $G_2$. For $$M_0 \leq \frac{G_0^2 + G_2^2}{2} - 1$$

the condition for the time is $$T \geq \frac{G_0^2 + G_2^2}{2} - M_0 + 1 + G_0 + G_2 \quad (3)$$

and for $$\frac{G_0^2 + G_2^2}{2} - 1 \leq M_0 \leq \frac{G_0^2 + G_2^2}{2}$$

the condition for the time is $$T \geq 2\sqrt{\frac{G_0^2 + G_2^2}{2} - M_0} + G_0 + G_2. \quad (4)$$

Only the following possible combinations of inequalities result for a given $M_0$: (1) and (4), (2) and (3) or (2) and (4).

For simplification of the inequality, a function $$f(x) = \begin{cases} x + 1 & \forall \quad x \geq 1 \\ 2\sqrt{x} & \forall \quad 0 < x < 1 \\ -2 & \forall \quad x \leq 0 \end{cases} \quad (5)$$

is appropriately introduced, with which boundary conditions are entirely described by the two inequalities $$T \geq f\left(\frac{G_0^2 + G_2^2}{2} + M_0\right) - G_0 - G_2 \quad (6)$$

and $$T \geq f\left(\frac{G_0^2 + G_2^2}{2} - M_0\right) + G_0 + G_2. \quad (7)$$

If, given a time slice of the warp type, a first moment $M_1$ should be fulfilled in addition to predetermined gradient amplitudes $G_0$ and $G_2$ at the beginning and at the end of the time slice, in addition to a predetermined time duration T and in addition to a predetermined zeroth moment $M_0$, a gradient current curve can be determined according to the method described in U.S. Pat. No. 6,636,038, whereby the gradient current curve now assumes a doubled trapezoidal shape (as shown in FIG. 6 and described in U.S. Pat. No. 6,636,038) so that both a predetermined moment $M_0$ and a predetermined moment $M_1$ can be realized. According to the definition, $M_1$ is thereby related to the beginning of the time slice outset. Here as well every arbitrary selection of the parameters $G_0$, $G_2$, $M_0$, $M_1$ and T cannot be realized by such a gradient current curve, as is explained in the following.

When the above inequality conditions (6) and (7) are satisfied, often a number of different gradient current trains can be satisfied by a gradient train with doubled trapezoidal shape with a given $G_0$, $G_2$, $M_0$ and T. The gradient trains shown in FIG. 6 thus all have the commonality that four of the five parameters are equal, namely $G_0$, $G_2$, $M_0$ and T; only the first moments $M_1$ of the gradient trains differ. Furthermore, for simplicity it is assumed in the following that all different gradient current trains as they are shown in FIG. 6 lie within the maximum amplitudes predetermined by the gradient coils 21. This assumption is therefore justified since only the underlying concept should be explained in the example shown in FIG. 6.

Of the gradient trains shown in FIG. 6, two gradient trains—namely the gradient trains without plateau phase $V_+$ and $V_-$—exhibit the peculiarity that a maximum positive first moment $M_1^+$ and a maximum negative moment $M_1^-$ can be realized therewith. The first moment $M_1$ of all other gradient trains (for example the gradient trains $V_e$ and $V_0$) lies between these two extreme values. The inequality condition that sets the parameters $G_0$, $G_2$, $M_0$ and T in relation to one another can therefore appropriately be formulated as inequalities in $M_1$:

$$M_1^-(G_0, G_2, M_0, T) \leq M_1 \leq M_1^+(G_0, G_2, M_0, T), \quad (8)$$

whereby $M_1^-(G_0,G_2,M_0,T)$ and $M_1^+(G_0,G_2,M_0,T)$ are formulated as functions in the parameters $G_0$, $G_2$, $M_0$ and T. Whenever these conditions are satisfied, a gradient train according to the form shown in FIG. 6 can be realized so that the predetermined moments $M_0$ and $M_1$ are satisfied within the time duration T and the predetermined start and end gradients $G_0$, $G_2$.

In many cases it is not necessary to specify a complete three-dimensional vector $\vec{M}_1=(M_{1x},M_{1y},M_{1z})$, but rather only one or two linear combinations of the form $\vec{a} \cdot \vec{M}_1=a_xM_{1x}+a_yM_{1y}+a_zM_{1z}=1$, whereby the vector $\vec{a}$, for example, specifies the direction that is relevant for speed-sensitive measurements. In particular given speed-sensitive measurements it is often even only necessary to specify not the absolute vector $\vec{M}_1$ but rather only a difference vector $\Delta\vec{M}_1$, of two absolute vectors. All of these cases can be informally formulated as linear equality conditions or inequality conditions that then contain the components of the $\vec{M}_1$-vectors as parameters.

2. Gradient Currents during a Time Slice of the Transmission or Acquisition Type Time slices of the transmission or acquisition type can also be described with the same parameters as a time slice of the warp type, i.e. by the parameters $G_0$, $G_2$, $M_0$ and T. Since the gradient current curve during a time slice is typically constant, this leads to the relatively simple equations $G_0=G_2=G$ and $M_0=GT$ that characterize a time slice of the transmission or acquisition type.

When no constant gradient is radiated during a time slice of the transmission or, respectively, acquisition type but rather, for example, a method according to DE 102 14 736 A1 is used, for example in order to calculate a k-space sampling path during a time slice of the acquisition type, other equality or, respectively, inequality conditions arise that set the parameters of the time slice of the transmission or, respectively, acquisition type in relation to one another.

The explanation above describes how control signals for the hardware of the magnetic resonance apparatus (in particular the gradient current curves) can be generated during one of the time slices when the time slice type and the characterizing parameters of the time slice are known, and the control signals can be achieved when the characterizing parameters satisfy specific boundary conditions.

The individual method steps that are based on this concept are now illustrated using FIG. 7. The individual method steps are initially explained only in brief. More detailed explanations regarding the individual method steps ensue below.

In a first method step 51 the measurement sequence is divided into a series of time slices, the division depending on the sequence type and on the k-space sampling type. Each time slice is thereby associated with one of the time slice types "transmission type", "warp type" or "acquisition type".

When, for example, a particularly simple sequence type (such as, for example, a spin echo sequence drawn in FIG. 4) should be generated with the inventive method, in which sequence type a k-space matrix 45 should be sampled in 256 lines. This means that a defined series of time slices composed of the transmission type, warp type, transmission type, warp type, acquisition type and warp type must be executed 256 times in order to correspond to the sequence type of the spin echo sequence and the k-space sampling type. The number and the sequence of the various time slices are thus established by the desired sequence type and the desired k-space sampling type.

An association of variables with each of the time slices ensues in a second method step 53, whereby in each time slice a variable is associated with each parameter describing this time slice.

The determination of boundary conditions with which value ranges of the variables are limited and/or the variables are set in relation to one another ensues in a third method step 55. These boundary conditions allow for the limitations predetermined by the hardware, but also take into account measurement sequence-characterizing conditions. Using the third method step 55 it can be ensured that, when solution values for the variables are found in the subsequent method step, these solution values also lead to a measurement sequence that can be executed on the hardware and that satisfies the desired characteristics.

In a fourth method step 57, solution values for the variables are now determined in that a predetermined target parameter is optimized under consideration of the boundary conditions. The target parameter can be specified, for example, as a function in the variables. Various optimization algorithms can be used as optimization methods. An advantageous optimization algorithm is subsequently described in detail.

In a fifth method step 59 the executable measurement sequence is obtained by associating the solution values of the variables with the corresponding parameters of the time slices. How a measurement sequence can be generated from this has in particular been explained for gradient current curves in the above examples for time slices. The measurement sequence is ultimately executed in a sixth method step 61 in which the individual time slices are implemented successively.

Advantageous method steps with which the inventive method can be additionally improved are now explained in the following.

After the third method step (or also after the fourth method step), in a seventh method step 63 it can be checked whether a value constellation (configuration) of the variables with which the predetermined target parameter of the measurement sequence is optimized can be found under consideration of the boundary conditions as they have been determined in the third method step 55. This case can occur, for example, when the set of measurement sequence parameters desired and input by a user cannot be executed on the hardware. In this case the boundary conditions that are predetermined by the hardware, in connection with the boundary conditions that allow for the desired measurement sequence parameters, lead to the situation that no constellation of solution values can be found for the variables. In this case the method can be interrupted and this can be displayed to a user.

Alternatively, in this case it is possible for the original boundary conditions to be relaxed in an eighth method step 65 so that the method is newly implemented with the changed boundary conditions until a variable constellation is found that then also leads to an executable measurement sequence.

Optionally, in the fourth method step 57 in which the solution values for the variables are determined, that order of the time slices that allows as optimal a measurement sequence as possible can also be determined. This embodiment variant of the inventive method is also explained in detail below.

In an optional ninth method step 67 that is executed according to the third method step 55, the boundary conditions can possibly be linearized since this (as described below) leads to a simpler solution capability of the mathematical optimization problem.

The third method step 55 of the determination of the boundary conditions is shown again in more detail using FIG. 8. Given the determination of boundary conditions, limitations 71 that enter from the hardware can, on the one hand, be taken into account in this manner in the optimization method. Additionally, it is possible to take into account measurement sequence-specific requirements 73, in particular here measurement sequence-specific time conditions 75, in that they are likewise formulated as boundary conditions. Spatial properties 77 of a k-space region to be sampled are also expressed as boundary conditions. Since hardware-dependent limitations 71 typically do not change, the associated boundary conditions can typically be stored once in memory of a computer with which the method is implemented. By contrast, the measurement sequence-specific requirements 73 as well as spatial properties 77 of a k-space region to be sampled can typically be definitively established only after a user has specified desired user parameters. Only then are the associated boundary conditions generated in their specific form and do they enter into the optimization method. It is the object of a sequence programmer to convert the input user parameters into concrete (actual) boundary conditions.

In the following the individual features of the method steps are explained and presented more precisely and in greater detail.

3. Boundary Conditions

After association of variables with the parameters describing the time slices, the value ranges of the variables are limited in a reasonable manner.

The boundary conditions reflect the natural limits of the individual variables or the limits predetermined by the hardware.

The value range of the variables that are associated with the time durations T of the respective time slices is thus limited to the effect that only positive values are allowed. The variables that are associated with the start and end values of the gradient amplitudes of the time slices are limited in terms of their value range to the effect that the values lie within the maximum amplitudes that can be realized by the gradient coils 21.

As explained above, the parameters of a specific time slice must satisfy specific conditions so that the measurement sequence can be executed on the hardware during the time slice, in particular the gradient current curve. These boundary conditions on the parameters also apply in an analogous manner for the variables associated with the parameters. In this manner it is ensured that, when solution values for the variables are found, from these the gradient current curve can also be implemented on the hardware of the magnetic resonance apparatus and the measurement sequence can thus also be executed.

This factor represents a decisive difference relative to conventional methods where the limitations predetermined by the hardware must typically be separately accounted for by a sequence programmer who programs the sequence such that the devised measurement sequence also corresponds to the limitations. However, since a sequence programmer can for the most part only roughly, and therefore not optimally, take the hardware limitations into account with such a heuristic approach, the developed measurement sequence cannot optimally utilize the hardware.

Further conditions characterizing a measurement sequence are also formulated as boundary conditions in the variables, such that they are taken into account in the obtained measurement sequence after implementation of the inventive method.

A difference also exists with regard to conventional methods for the programming of a measurement sequence, for which conditions characterizing the measurement sequence must be explicitly taken into account by a sequence programmer in the design of the measurement sequence. In the inventive method these conditions are taken into account by being formulated as boundary conditions and thus are included in the optimization problem.

For example, one of these conditions in the image contrast. It is necessary that the acquisition of the measurement signal ensues at a defined temporal interval from the excitation pulse. For the parameters or variables describing the time slices, this means that weighted sums of the durations of sub-sets of the time slices adhere to specific values. For example, a specific echo time $T_E$ to be adhered to can be formulated as a boundary condition:

$$T_E = \sum_{i \in I} a_i T_i,$$

whereby $a_i$ are weighting factors and the set I encompasses the indices of that subset of the time slices whose time durations are essential for the image contrast. The same analogously applies for other time requirements such as the repetition time $T_R$ or the readout time duration $T_{ADC}$.

Another example of a condition characterizing the measurement sequence is the spatial bearing of the k-space matrix 45 to be sampled in the subject to be examined. This ensues by a rotation of the parameters describing a time slice from a logical coordinate system (P, R, S) into the physical coordinate system (x, y, z) of the gradient coils 21. This tilting is likewise formulated as a boundary condition in the variables. For example, so that a specific bearing of the k-space matrix to be sampled can be realized during a time slice of the acquisition type or of the transmission type, it applies that the ratios of the gradient amplitudes $G_j$, $j \in \{x,y,z\}$ during these time slices in the x-, y- and z-directions correspond to the direction cosines of the k-space matrix in the slice and readout directions. In this manner the parameters relevant for the execution of the measurement sequence in the physical coordinate system remain linear combinations of quantities that describe the k-space matrix.

Other conditions that characterize a measurement sequence and that can be formulated without problems as boundary conditions in the variables are, for example, the size of the k-space matrix, the three-dimensional pixel size or the image region (FOV) to be scanned.

Other optional conditions can likewise be formulated as boundary conditions in the variables. One is, for example, the order of the individual experiments (for example the manner of the interleaving of individual slices in the event that a multi-slice technique is applied).

The conditions characterizing a measurement sequence can be incorporated into the optimization problem via the formulation of the conditions characterizing the measurement sequence as boundary conditions. Given the discovery of the solution values it is thus automatically ensured that these conditions are also adhered to.

A further group of conditions are encompassed under the designation "integral conditions" that are characterized in that they concern evaluation quantities of individual time slices summed over a number of time slices, such as, for example, the total radiated RF energy dose. State variables that reflect the appertaining state at the respective time slice end are advantageously introduced for these evaluation quantities. These state variables can also be expressed as functions of the variables that are associated with parameters describing the time slice. Integral conditions can be expressed in this manner as boundary conditions in the variables and largely be reduced to two respective local boundary condition types. First, the transition boundary conditions from the beginning to the end of the time slice, inclusive of the influence of the time slice itself. Second, the state boundary conditions at the end of the time slice. In the following some of these integral conditions are described in detail.

For patient safety, the RF power dose is to be limited. The corresponding boundary condition is $$T_\Sigma \geq \sum_{i \in S} \frac{A_i}{T_i} = \sum_{i \in S} \frac{A_i}{M_{0,i}} G_i$$

with the total measurement time $T_\Sigma$. The weightings $A_i$ are always positive for time slices of the transmission type and equal to zero for time slices of the warp and acquisition types, meaning that the summation effectively ensues only across the set of the time slices of the transmission type. Furthermore, the weightings are proportional to the amplitude-square integral. If a dimensionless constant $\kappa$ is introduced that specifies the SAR(specific absorption rate)-multiple exposure in comparison to a flip angle-equivalent square RF pulse:

$$\kappa = \frac{T \int_0^T |B_1|^2 dt}{\left| \int_0^T B_1 dt \right|^2},$$

the square of the flip angle $$\alpha = \gamma \left| \int_0^T B_1 dt \right|$$

can be considered as a reference quantity and $A_i \sim \alpha_1^2 \kappa_i$ applies for the pulse i. Typical values for $\kappa$ are $\kappa=1$ for square pulses and $\kappa=3.8$ for slice-selective RF pulses, depending on selectivity.

For square pulses, for example, on a typical 1.5 Tesla system the limit power of 400 W for a 100 kg patient, i.e. a dose of 4 W/kg, is directly reached when a respective 1 ms-longer rectangular RF pulse with $\alpha=360°$ flip angle is sent every 100 ms. A (non-normalized) $A=10^{-4} s^2$ results from this. A 90° pulse would have, for example, $A=6.7 \times 10^{-6} s^2$ and could thus be sent 16 times more frequently, i.e. every 6.7 ms.

A further such integral condition is the radiated RF transmission energy that is limited due to hardware limitations. The RF transmission has a relatively small maximum pulse-pause ratio. A model taking this fact into account assumes that each RF pulse effects a debit from an energy account $E_i$, whereby $0 \leq E_i \leq 1$ and the index i specifies the value of $E_i$ after the i-th time slice. The energy account has a constant recovery rate R up to a maximum value of 1, such that $E_i \leq E_{i-1}+RT_i$. Upon transmission the discharge $S_i$ is proportional to the integral of the RF pulse amplitude, i.e. to the flip angle $\alpha$ of the i-th time slice, such that: $E_i \leq E_{i-1}+RT_i-S_i i$. Two such accounts with various charge and discharge rates are used for the transmitter currently employed.

A further integral condition concerns the gradient system and its work cycle (gradient duty cycle). The gradient system is in the position to emit high amplitudes only for a limited time. The load measure is here the integral $$D = \int_0^T G(t)^2 dt.$$

The integral condition should ensure that the total load that occurs from the beginning of the measurement up to then remains within specific limits. Here the problem also lends itself to being described using a model operating with accounts. The state of the gradient system after the i-th time slice is described via the account $F_i$, whereby $0 \leq F_i \leq 1$ applies. The value $F_i$ changes within a time slice according to the following correlation: $F_i \leq F_{i-1}+KT_i-LD_i$, whereby K represents the recovery or cooling rate, L represents the discharge or load rate and $D_i$ represents the load of the gradient amplitude (as explained subsequently). A sufficiently uniform distribution of the load within the time slice is hereby implicitly assumed. A typical gradient system in total requires four accounts in order to model the load of each individual axis and the sum of the axes (i.e. the total cooling capacity). The load of one axis of a time slice of the transmission or, respectively, acquisition type with constant gradient amplitude G is given by $D=G^2T=M_0G$. The dependency of the load during a time slice of the warp type on the descriptive parameters $D(G_0, G_2, M_0, T)$ is more complex. Here as well a conservative approximation is sufficient. However, $M_0^2/T \leq D \leq T$ and $D \geq (|G_0|^3+|G_2|^3)/3$ always apply.

A simpler way to model gradient systems ensues not via these rates but rather through the use of the maximum amplitude (here normalized to 1), the maximum retention duration $\tau$ of the maximum amplitude and the maximum abiding possible relative amplitude $\eta$. This means that the maximum amplitude (D=T) within $T=\tau$ empties a full account $(0=1+K\tau-L\tau)$. At the amplitude $\eta$ (i.e. $D=\eta^2T$) the charge and discharge rates directly rise to $0=K-L\eta^2$.

$$K = \frac{\eta^2}{\tau(1-\eta^2)}$$

and $$L = \frac{1}{\tau(1-\eta^2)}$$

follow from this. Non-normalized rates $K=80 s^{-1}$ and $L=180 s^{-1}$ result for a typical gradient system with $\eta=0.67$ and $\tau=0.01$ s.

4. Linearization of the Boundary Conditions

When the conditions that should be satisfied during a measurement sequence are formulated as boundary conditions in the variables, non-linear boundary conditions typically arise. For example, the conditions specified in the segment "gradient currents during a time slice of the warp type" that set the parameters describing a time slice in relation to one another are of a non-linear nature (see, for example, the correlations (6) and (7) that are formulated with the non-linear function f(x) (5)).

If such a condition should be considered as a boundary condition in the optimization method, the non-linear correlation prevents the use of specific optimization methods that can often be implemented quicker and/or more simply. How this problem can be countered is described in the following using the boundary conditions (6) and (7).

This occurs via an approximation of the function f(x) (5) via a special ordered set type 2 (SOS2) from above. For example, the function $\tilde{f}$ $$f(x) \approx \tilde{f}(x) = \begin{cases} 1+x & \forall & x \geq 0.64 \\ 0.64+x/0.64 & \forall & 0.2304 \leq x < 0.64 \\ 0.36+x/0.36 & \forall & 0.0576 \leq x < 0.2304 \\ 0.16+x/0.16 & \forall & 0.0064 \leq x < 0.0576 \\ 0.04+x/0.04 & \forall & 0 \leq x < 0.0064 \\ -2 & \forall & x < 0 \end{cases}$$

has an error interval $\tilde{f}-f \in [0,0.04]$.

Two function values are required for the arguments $$x_0 = \frac{G_0^2 + G_2^2}{2} + M_0$$

and $$x_1 = \frac{G_0^2 + G_2^2}{2} - M_0.$$

The coverages to be shown are $x_0 \in [M_0, M_0+1]$ and $x_1 \in [-M_0, 1-M_0]$. The limited value ranges likewise yield significant simplifications relative to the above complete function representation. In the event that $M_0$ is not constant but rather is a variable, its lower and upper limits are to be set reasonably.

After this first linearization of the function f via $\tilde{f}$, the problem of the quadratic dependencies on $G_0$ and $G_2$ remains. For this two auxiliary quantities $h_0$ and $h_2$ are appropriately introduced as variables for which $$h_0 \geq \frac{G_0^2}{2}$$

and $$h_2 \geq \frac{G_2^2}{2}$$

should apply. Due to the monotony of the functions f and $\tilde{f}$, $\tilde{f}(h_0+h_2+M_0) \geq f(x_0)$ and $\tilde{f}(h_0+h_2-M_0) \geq f(x_1)$ likewise apply.

The auxiliary quantities $h_0$ can in turn approximate the parabola $$\frac{G_0^2}{2},$$

possibly from above. For example, $h_0 \geq 0.75 G_0 - 0.25$ $h_0 \geq 0.25 G_0$ $h_0 \geq -0.25 G_0$ $h_0 \geq -0.75 G_0 - 0.25$ come under consideration. The error interval in the example is only [0, 1/32] in the entire value range interval [−1, +1], in spite of the rough discrimination. The algebraic sign of $G_0$ is in fact already known, such that either only the first two inequalities or only the last two inequalities are really necessary and also the value range of the amplitude value can always be further limited. Analogous considerations apply for $h_2$ and $G_2$.

As a result, a time slice of the warp type based on the conservative approximation directions in $\tilde{f}$, $h_0$ and $h_2$ can be safely realized (if not also in the shortest possible time) when the two inequalities $T \geq \tilde{f}(h_0+h_2+M_0) - G_0 - G_2$ and $T \geq \tilde{f}(h_0+h_2-M_0) + G_0 + G_2$ are adhered to. Since $M_0$ linearly enters into both arguments $x_0$ and $x_1$ of the function f or, respectively, $\tilde{f}$, it causes no difficulty to carry them over into a linear program either a constant or as a variable.

For example, it is also possible to distribute an $M_0$ to be realized. In a spin echo sequence, for example, given a time slice of the warp type before a 180° RF pulse and in the following time slice of the warp type any $M_0$ can be allowed as long as its difference corresponds to the $M_0$ to be realized.

The condition stated above of a time slice of the transmission or, respectively, acquisition type given which a more constant gradient is radiated and that is characterized by $M_0$=GT is a non-linear boundary condition. In the following a possibility of the linearization of this boundary condition is described.

The product GT can be replaced by the identity $$GT = \frac{(T+G)^2 - (T-G)^2}{4},$$

whereby the two parabolas are approximated by an SOS2-approximation that is linear in parts. Here the approximation error may possess both algebraic signs.

Given a constant $M_0$, an SOS2-representation of the hyperbolic dependency $$G(T) = \frac{M_0}{T}$$

for the allowed time interval is more reasonable: in the interval $T \in [T_0, T_1]$ the linear approximation $$\frac{1}{T} \approx \frac{(\sqrt{T_0} + \sqrt{T_1})^2 - 2T}{2T_0 T_1}$$

has a maximum absolute error $$\varepsilon = \frac{(\sqrt{T_0} - \sqrt{T_1})^2}{2T_0 T_1}.$$

The error is maximally negative at both interval limits, meaning that the function values are $$\frac{1}{T_0} - \varepsilon$$

and $$\frac{1}{T_1} - \varepsilon$$

and it is maximally positive $$\left(\frac{1}{\sqrt{T_0 T_1}} + \varepsilon\right)$$

at the geometric interval center $T = \sqrt{T_0 T_1}$.

For precision reasons it is for the most part necessary to divide the interval to be shown into a plurality of partial intervals. For a maximum error $\pm \varepsilon$ beginning with $T_{k=0} = T_{min}$, the widths or, respectively, the nodes (sampling points) of said partial intervals should be recursively set according to $$\frac{1}{\sqrt{T_k}} = \frac{1}{\sqrt{T_{min}}} - k\sqrt{2\varepsilon}$$

up to $T_{N-1} \geq T_{max}$. At the latest, $T_{N-1} = \infty$ when the difference is zero or negative.

$$N \geq \frac{1}{\sqrt{2\varepsilon T_{min}}} - \frac{1}{\sqrt{2\varepsilon T_{max}}}$$

follows from this for the necessary number of sub-intervals.

The time interval to be shown is always limited towards the bottom by the moment $M_0$ and also by the peak power of the transmitter and at the top end by the maximum allowable transmission duration $|M_0| = T_{min} \leq T \leq T_{max} \leq T_{transmission}$. This possibly also reduces the range of the gradient amplitudes.

5. Optimization Problem

The optimization problem exists in that, after a plurality of variables have been established for the measurement sequence as described above, a predetermined target parameter is optimized (for example in that the target parameter is expressed as a function in the variables) and those values for which the target parameter assumes an extreme value are found for the variables. All kinds of target parameters can be optimized as an optimization target. Here the minimization of the total time, the minimization of all times except for the readout times $T_{ADC}$ or another weighted simulation of the time slice duration are cited only by way of example. These temporal quantities consequently characterize time-related quantities of the measurement sequence.

By the linearization of the boundary conditions described above and shown in examples, the optimization problem can be fashioned as a linear optimization problem for which there are known, efficient solution algorithms such as, for example, the simplex algorithm.

However, the case possibly arises that adjustments of a measurement sequence that are required by the user cannot be realized. In the method this leads to the situation that no constellation of solution values for the variables can be found. In this case, for example, the method can be modified such that a targeted relaxation of the blocking boundary conditions or a subset thereof ensues and the optimization method is thereupon implemented again.

6. Free Linking of Time Slices

In an advantageous embodiment of the method the rigid sequence of the individual time slices is also overridden and is likewise subjected to an optimization. That permutation of the time slices given which the predetermined target parameter assumes an extreme value is thereby determined. For example, graph theory methods can be used as methods for determination of the optimal permutation of the time slices, as explained in the following.

In contrast to previous measurement sequences in which the linking of the individual time slices was subject to no optimization, the linking of the individual time slices is typically established by means of nested loops. This leads to non-optimal measurement sequences from multiple points of view. First, only a fraction of the arrangement possibilities that are possible in principle can be achieved in this manner, and furthermore limitations in the flexibility arise. The number of the passes of two nested loops is thus the product of the individual loop passes. The possible pass counts are therewith severely limited and, for example, cannot be prime. Furthermore, the problem occurs that the end of the loop body is connected both with the start of the loop body and with the time slice that is executed after leaving the loop since the control flow branches at the end of the loop body. An equivalent problem occurs at the loop start. This means that every N-multiple sequence loop exhibits a time slice of the warp type run through (N−1) times, namely the time slice that connects the loop end with the loop start, and additionally exhibits a specific time slice of the warp type at the input and at the output of the loop. The extraction, for example of the total run time, is therewith made unnecessarily difficult.

Instead of the rigid loop notation of a measurement sequence, in the inventive method a directed graph can now be introduced that defines the order of the time slices of the transmission type and acquisition type. The edges of the directed graph in this case represent the time slices of the warp type. The information necessary to set up the optimization problem can then be extracted from the graph, for example by means of a spanning tree algorithm.

It is understood that an arrangement of the individual time slices may not ensue arbitrarily given such an optimization that also allows different orders of the individual time slices. That only reasonable links can be taken into account in the optimization can be ensured, for example, by corresponding boundary conditions to be introduced that, among other things, accommodate the k-space sampling type and thus define the sequence type.

When, for example, the order of the individual time slices in a spin echo sequence is overridden and is subjected to an optimization process, it must nevertheless remain ensured that time slice sub-chains of the type "transmission type-warp type-transmission type-warp type-acquisition type-warp type" are retained. The chains of each of the slices (whose number can also vary from slice to slice) must for the most part ensue in a fixed clock pulse (the repetition time $T_R$). The order of these time slices sub-chains is, however, not further defined in principle and can be optimized via the optimization method, in which the order of the time slices is also variable.

The transition from one time slice sub-chain to the next time slice sub-chain is respectively ensured by a separate time slice of the warp type.

The advantage that results from the method appears even clearer in another, subsequently described example in that the order of the time slices is variable and the optimal permutation of the time slices is found.

In the pulse sequence known as a turbo spin echo sequence, after an excitation pulse a plurality of 180° rephrasing pulses are radiated and the measurement signal is acquired after each of the 180° rephrasing pulses. If, for example, the measurement signal is acquired five times given such a time slice sub-chain, five k-space rows can be scanned. At least 52 time slice sub-chains are necessary for 256 desired k-space rows, such that 260 rows can be measured. It is therefore advantageous to be able to propose chains of varying length as candidates. Given a method in which the order of the time slices is variable and in which the optimal permutation of the time slices is found, for example, time slice sub-chains of varying length can thus be found. In the stated example, an optimal turbo spin echo sequence could comprise 50 five-chains and two three-chains.

Since the chain duration is for the most part distinctly shorter than the repetition time $T_R$, time slice sub-chains of other slices can be interlaced in the remaining time. The optimal interleaving of the time slice sub-chains of the individual slices can then also be found with the method.

Although modifications and changes may be suggested by those skilled in the art, it is the intention of the inventor to embody within the patent warranted hereon all changes and modifications as reasonably and properly come within the scope of his contribution to the art.

I claim:

1. A method for computer-assisted generation of an executable measurement sequence that is able to be executed by existing hardware of a magnetic resonance apparatus based on a measurement sequence having a sequence type and k-space sampling having a sampling type, comprising the steps of:
    dependent on the type of said measurement sequence and the type of said k-space sampling, dividing said selected measurement sequence into a series of time slices selected from the group consisting of transmission type, acquisition type, and warp type, each of said time slices being characterized by at least one parameter for that time slice;
    for each parameter of each of said time slices, associating a mathematical variable with that parameter, as respective associated variables;
    for at least one of the associated variables, determining at least one boundary condition selected from the group consisting of a range for that variable and a relationship of that associated variable to at least one other of the associated variables;
    based on at least one target parameter for the measurement sequence, in a computer automatically determining, for said associated variables, respective solution values that optimize said target parameter under constraint by said at least one boundary condition;
    generating an executable measurement sequence, that is able to be executed by said existing hardware, by setting the respective parameters of said time slices in said selected measurement sequence to said solution values; and
    implementing said executable measurement sequence with said existing hardware by generating and supplying control signals to said existing hardware in each of said time slices that cause said executable measurement sequence to be executed by said existing hardware.

2. A method as claimed in claim 1 comprising dividing the selected measurement sequence into said series of time slices in a selected order within said series, and comprising changing said order of said time slices within said series as a contribution to optimizing said target parameter under constraint by said at leas one boundary condition.

3. A method as claimed in claim 1 comprising, if no solution values can be determined, altering said at least one boundary condition, and repeating the determination of respective solution values with the at least one altered boundary condition.

4. A method as claimed in claim 1 comprising, for each of said time slices, selecting said at least one parameter that characterizes that time slice from the group consisting of a time duration of that time slice, a gradient-time integral within that time slice, and a start value of a gradient amplitude at a beginning of that time slice and an end value of a gradient amplitude at an end of that time slice.

5. A method as claimed in 1 comprising determining said solution values by
    specifying said target parameter as a function of the associated variables;
    in said computer, determining a point at which said function assumes an extreme value in a multi-dimensional space that encompasses the associated variables and that is limited by the said at least boundary condition; and
    determining said solution values respectively as values that the associated variables have at the coordinates of said point in said multi-dimensional space.

6. A method as claimed in claim 5 comprising specifying said at least one boundary condition as at least one of equalities or inequalities of the associated variables.

7. A method as claimed in claim 6 comprising specifying said at least one boundary condition as at least one of linearized equalities or linearized inequalities of the associated variables.

8. A method as claimed in claim 7 comprising determining said point at which said function assumes an extreme value by a simplex optimization method.

9. A method as claimed in claim 1 comprising specifying said at least one boundary condition as at least one of equalities or inequalities of the associated variables.

10. A method as claimed in claim 1 comprising selecting said at least one boundary condition as at least one boundary sub-condition corresponding to requirements that are specific to said measurement sequence.

11. A method as claimed in claim 10 comprising selecting said at least one boundary sub-condition as at least one time condition that is specific to said measurement sequence.

12. A method as claimed in claim 10 wherein said at least one boundary sub-condition corresponding to requirements that are specific to said measurement sequence is a first boundary sub-condition, and comprising selecting said at least one boundary condition from among the group consisting of said first boundary sub-condition, a second boundary sub-condition representing a spatial property of a k-space range to be sampled by said k-space sampling in said measurement sequence, a third boundary sub-condition representing an operational limitation of said existing hardware, and a fourth boundary sub-condition for at least one of said time slices that represents a relationship among multiple parameters that characterize said at least one of said time slices.

13. A method as claimed in claim 1 comprising determining at least one of said boundary conditions as a relationship between respective variables in different ones of time slices.

14. A method as claimed in claim 1 comprising designating said target parameters as a temporal quantity of the selected measurement sequence.

15. A magnetic resonance apparatus comprising:
- apparatus hardware for executing a measurement sequence to obtain magnetic resonance data;
- a computerized control unit that generates control signals for operating said apparatus hardware;
- said computerized control unit being programmable with a measurement sequence having a sequence type and a k-space sampling, for use with said measurement sequence, having a sampling type;
- said computerized control unit also being programmed to divide said measurement sequence, dependent on the type of said measurement sequence and the type of said k-space sampling, into a series of time slices selected from the group consisting of transmission type, acquisition type, and warp type, each of said time slices being characterized by at least one parameter for that time slice;
- said computerized control unit, for each parameter of each of said time slices, being programmed to associate a mathematical variable with that parameter as an associated variable;
- said computerized control unit, for at least one of the associated variables, being programmed to determine at least one boundary condition selected from the group consisting of a range for that variable and a relationship of that associated variable to at least one other of the associated variables;
- an input unit connected to said computerized control unit allowing designation of at least one target parameter for said measurement sequence;
- said computerized control unit being programmed to automatically determine, for said associated variables, respective solution values that optimize said target parameter under constraint by said at least one boundary condition; and
- said computerized control unit being programmed to generate an executable measurement sequence, that is able to be executed by said existing hardware, by setting the respective parameters of said time slices in said selected measurement sequence to said solution values, and to implement said executable measurement sequence with said existing hardware by generating and supplying control signals to said existing hardware in each of said time slices that cause said executable measurement sequence to be executed by said existing hardware.

16. A computer-readable medium encoded with a data structure that is loadable into a computerized control unit of a magnetic resonance apparatus having apparatus hardware, for computer-assisted generation of a measurement sequence that is able to be executed by said apparatus hardware, said data structure causing said computerized control unit to:
- for a measurement sequence having a sequence type and a k-space sampling used with said measurement sequence having a sampling type, divide said measurement sequence, dependent on the type of said measurement sequence and the type of said k-space sampling, into a series of time slices selected from the group consisting of transmission type, acquisition type, and warp type, each of said time slices being characterized by at least one parameter for that time slice;
- for each parameter of each of said time slices, associate a mathematical variable with that parameter as an associated variable;
- for at least one of the associated variables, determine at least one boundary condition selected from the group consisting of a range for that associated variable and a relationship of that associated variable to at least one other of the associated variables;
- based on at least one target parameter for said measurement sequence, determine for said associated variables, respective solution values that optimize said target parameter under constraint by said at least one boundary condition;
- generate an executable measurement sequence, that is able to be executed by said existing hardware, by setting the respective parameters of said time slices in said selected measurement sequence to said solution values; and
- implement said executable measurement sequence with said existing hardware by generating and supplying control signals to said existing hardware in each of said time slices that cause said executable measurement sequence to be executed by said existing hardware.

* * * * *